(12) United States Patent (10) Patent No.: US 8,205,175 B2
Waters et al. (45) Date of Patent: *Jun. 19, 2012

(54) STRUCTURED ALGORITHMIC PROGRAMMING LANGUAGE APPROACH TO SYSTEM DESIGN

(75) Inventors: Simon Joshua Waters, Newberg, OR (US); Peter Pius Gutberlet, Wilsonville, OR (US); Andres Rafael Takach, Wilsonville, OR (US)

(73) Assignee: Calypto Design Systems, Inc., Santa Clara, CA (US)

( * ) Notice: Subject to any disclaimer, the term of this patent is extended or adjusted under 35 U.S.C. 154(b) by 1181 days.

This patent is subject to a terminal disclaimer.

(21) Appl. No.: 11/877,599

(22) Filed: Oct. 23, 2007

(65) Prior Publication Data

US 2008/0141227 A1 Jun. 12, 2008

Related U.S. Application Data

(60) Division of application No. 10/753,262, filed on Jan. 5, 2004, now Pat. No. 7,308,672, which is a continuation of application No. 09/957,442, filed on Sep. 18, 2001, now Pat. No. 6,701,501.

(60) Provisional application No. 60/240,883, filed on Oct. 16, 2000, provisional application No. 60/257,923, filed on Dec. 21, 2000.

(51) Int. Cl.
*G06F 17/50* (2006.01)

(52) U.S. Cl. ........... 716/101; 716/103; 703/14; 717/137

(58) Field of Classification Search .................. 716/101, 716/103; 703/14; 717/137
See application file for complete search history.

(56) References Cited

U.S. PATENT DOCUMENTS

| | | | |
|---|---|---|---|
| 5,870,585 A | | 2/1999 | Stapleton |
| 5,953,519 A | * | 9/1999 | Fura .............................. 716/104 |
| 6,053,947 A | | 4/2000 | Parson |
| 6,152,612 A | * | 11/2000 | Liao et al. ........................ 703/23 |
| 6,167,363 A | | 12/2000 | Stapleton |
| 6,226,776 B1 | | 5/2001 | Panchul et al. |
| 6,233,540 B1 | | 5/2001 | Schaumont et al. |

(Continued)

OTHER PUBLICATIONS

Ade et al., "Hardware-Software Codesign with GRAPE," *Proceedings of the Sixth IEEE International Workshop on Rapid System Prototyping*, pp. 40-47 (Jun. 1995).
Elliott, J.P., *Understanding Behavioral Synthesis*, "Table of Contents," "Chapter 2: An Introduction to Behavioral Synthesis," "Chapter 3: The Behavioral Synthesis Process," "Chapter 4: Data Types," "Chapter 5: Entities, Architectures, and Processes," "Chapter 10: Functions, Procedures, and Packages," "Chapter 12: Reusable Test Benches," "Chapter 13: Coding for Behavioral Synthesis," "Index," Kluwer Academic Publishers Group, pp. v-xiv, 5-23, 25-40, 41-55, 57-76, 173-180, 197-211, 213-243, 313-319 (1999).

(Continued)

*Primary Examiner* — Naum Levin
(74) *Attorney, Agent, or Firm* — Klarquist Sparkman, LLP

(57) ABSTRACT

An algorithmic programming language approach to system design enables design, synthesis, and validation of structured, system-level specifications, and integrates system-level design into the rest of the design process. The algorithmic programming language design approach includes various techniques and tools, which can be used in combination or independently. For example, the design approach includes techniques and tools for simplifying specification of a design unit interface in a programming language specification and/or simplifying specification of synchronization and sub-design unit concurrency for a design unit. According to a first aspect of the design approach, design occurs at the algorithmic level of abstraction. According to a second aspect, the design approach leverages existing simulation technology for validation at various stages of the design flow. According to a third aspect, a design tool synthesizes a structured, programming language specification into a lower-level specification, such as a VHDL specification.

17 Claims, 9 Drawing Sheets

U.S. PATENT DOCUMENTS

| | | | |
|---|---|---|---|
| 6,385,757 B1 * | 5/2002 | Gupta et al. | 716/102 |
| 6,438,514 B1 | 8/2002 | Hill et al. | |
| 6,457,164 B1 * | 9/2002 | Hwang et al. | 716/121 |
| 6,484,177 B1 | 11/2002 | Van Huben et al. | |
| 6,584,601 B1 | 6/2003 | Kodosky et al. | |
| 6,606,588 B1 | 8/2003 | Schaumont et al. | |
| 6,701,501 B2 | 3/2004 | Waters et al. | |
| 6,721,942 B1 * | 4/2004 | Sievert | 717/137 |

OTHER PUBLICATIONS

"Monet Interactive Architectural Exploration Through Behavioral Design," 3pp. [Downloaded from the World Wide Web ob Feb. 6, 2001.].

"Monet Technical Papers,"1 p. [Downloaded from the World Wide Web on Feb. 6, 2001.].

Elliott, J., *An Introduction to Architectural Exploration*, "Part I: Introduction & Terminology," 8pp. (Mar. 1998).

Elliott, J., *An Introduction to Architectural Exploration*, "Part II: I/O Modes," 12 pp. (Apr. 1998).

Elliott, J., *An Introduction to Architectural Exploration*, "Part III: Loops," 8pp. (Apr. 1998).

Elliott, J., *An Introduction to Architectural Exploration*, "Part IV: Handshaking," 4pp. (Apr. 1998).

Elliott, J., *An Introduction to Architectural Exploration*, "Part V: Reusable Text Benches," 8pp. (Apr. 1998).

Wayne Wolf, "Object-Oriented Co-Synthesis of Distributed Embedded Systems," Proc. ASP-DAC '95, pp. 553-558 (1995).

Lipton et al., "PDL++: An Optimizing Generator Language for Register Transfer Design," IEEE International Symposium on Circuits and Systems, pp. 1135-1138 (1990.

Liao et al., "An Efficient Implementation of Reactivity for Modeling Hardware in the Scenic Design Environment," Proc. DAC '97, 6 pp. (1997).

De Micheli et al., "The Olympus Synthesis System," IEEE Design & Test of Computers, vol. 7, Issue 5, pp. 37-53 (Oct. 1990).

Zhu et al., "Syntax and Semantics of the SpeC Language," Proc. Workshop on Synthesis and System Integration of Mixed Technologies, 8 pp. (Dec. 1997).

Guido Arnout, "SystemC Standard," Proc. DAC '00, pp. 573-577 (2000).

Semeria et al., "Methodology for Hardware/Software Co-verification in C/C++," Proc. DAC '00, pp. 405-408 (2000).

Miscellaneous Web pages printed from CynApps World Wide Web site, 28 pp. [Downloaded from the World Wide Web on Sep. 14, 2001.].

CynApps, "CynLib™ Language Reference Manual," Cynlib Release 1.4.0, 90 pp. [Downloaded from the World Wide Web on Sep. 14, 2001.].

CynApps, "CynLib Users Manual," Cynlib Release Version 1.4.0, 120 pp. [Downloaded from the World Wide Web on Sep. 14, 2001.].

John Sanguinetti, "Bridging the Gap with Cynthesis," 6 pp. [Downloaded from the World Wide Web on Sep. 14, 2001.].

Andy Goodrich, "Design by Successive Elaboration," 12 pp. [Downloaded from the World Wide Web on Sep. 14, 2001.].

Svarstad et al., "A Model for Describing Communication between Aggregate Objects in the Specification and Design of Embedded Systems," 9 pp. [Downloaded from the World Wide Web on Nov. 4, 2001.].

Mueller et al., "The Simulation Semantics of SystemC," 7 pp. [Downloaded from the World Wide Web on Nov. 4, 2001.].

Siegmund et al., "SystemCSV: An Extension of SystemC for Mixed Multi-Level Communication Modeling and Interface-Based System Design," 7 pp. [Downloaded from the World Wide Web on Nov. 4, 2001.].

Economakos et al., "Behavioral Synthesis with SystemC," 5 pp. [Downloaded from the World Wide Web on Nov. 4, 2001.].

Charest et al., "A Methodology for Interfacing Open Source SystemC with a Third Party Software," 5 pp. [Downloaded from the World Wide Web on Nov. 4, 2001.].

Fin et al., "SystemC: A Homogenous Environment to Test Embedded Systems," 6 pp. [Downloaded from the World Wide Web on Nov. 4, 2001.].

Fin et al., "The Use of SystemC for Design Verification and Integration Test of IP-Cores," 5 pp. [Downloaded from the World Wide Web on Nov. 4, 2001.].

Agliada et al., "On the Reuse of VHDL Modules into SystemC Designs," 5 pp. [Downloaded from the World Wide Web n Nov. 4, 2001.].

Fin et al., "AMLETO: A Multi-language Environment for Functional Test Generation," 8 pp. [Downloaded from the World Wide Web on Nov. 4, 2001.].

Heinz-Josef Schlebusch, "Converging SystemC with VSIA System-Level Data Types," VSIA Member Meeting, VSIA Alliance, 16 pp. (Mar. 13, 2001). [Downloaded from the World Wide Web on Nov. 4, 2001.].

Stuart Swan, "An Introduction to System Level Modeling in SystemC 2.0," Open SystemC Initiative, 13 pp. (May 2001). [Downloaded from the World Wide Web on Nov. 4, 2001.].

Thomas Komarek, "C Based System Level Design," 60 pp. [Downloaded from the World Wide Web on Nov. 4, 2001.].

Bollano et al., "SystemC's Impact on the Development of IP Libraries," IP2000 Europe Conference, 9 pp. (Oct. 2000). [Downloaded from the World Wide Web on Nov. 4, 2001.].

Heinz-Josef Schlebusch, "C-based Design of Systems-on-Chip: An EDA Perspective," 45 pp. [Downloaded from the World Wide Web on Nov. 4, 2001.].

Gerlach et al., "System Level Design Using the SystemC Modeling Platform," 5 pp. [Downloaded from the World Wide Web on Nov. 4, 2001.].

Kranen et al., "Open SystemC Initiative," SystemC Users Forum, DAC—Jun. 2000, 74 pp. [Downloaded from the World Wide Web on Nov. 4, 2001.].

Transmodeling, Inc., "Systems to HDL Incrementally, SystemC" 7 pp. (Apr. 2000). [Downloaded from the World Wide Web on Nov. 4, 2001.].

"Modeling A 3D Graphics Pipeline with SystemC," ST Microelectronics, Advanced System Technology, SNUG, 7 pp. (Mar. 15, 2000). [Downloaded from the World Wide Web on Nov. 4, 2001.].

"Overview of the Open SystemC Initiative," 2 pp. [Downloaded from the World Wide Web on Nov. 4, 2001.].

Karen Bartleson, "A New Standard for System-Level Design," Synopsys, 6 pp. (Sep. 1999). [Downloaded from the World Wide Web on Nov. 4, 2001.].

Jamison et al., "Connecting the Value Chain with SystemC," 4 pp. (Sep. 1999). [Downloaded from the World Wide Web on Nov. 4, 2001.].

Guido Arnout, "C for System Level Design," 4 pp. [Downloaded from the World Wide Web on Nov. 4, 2001.].

Gerstlauer et al., "SpecC System-Level Design Methodology Applied to the Design of a GSM Vocoder," Proc. Ninth Workshop on Synthesis and System Integration of Mixed Technologies, Kyoto, Japan, 8 pp. (Apr. 2000).

Dömer et al., "SpecC Language Reference Manual," Version 1.0, 88 pp. (Mar. 6, 2001).

Doemer, "SpecC Language Reference Manual, V1.0," Release Notes, 3 pp. (Mar. 2001).

Rumbaugh, James et al., *Object-Oriented Modeling and Design*, "Copyright Page" "Table of Contents," "Chapter 1: Introduction," and "Index," Prentice-Hall, Inc., pp. ii, iii-viii, 1-14, and 491-500 (1991).

Shlaer, Sally et al., *Object Lifecycles: Modeling the World in States*, "Copyright Page," "table of Contents," "Chapter 1: Overview of Objected-Oriented Analysis," and "Index," Prentice-Hall, Inc., pp. iv, v-viii, 1-9, and 245-251 (1992).

Andreas Gerstlauer, "SpecC, Center for Embedded Computer Systems," 3 pp. [Downloaded on Nov. 4, 2001].

Dömer et al., "The SpecC Language Reference Manual," Technical Report ICS-98-13, Dept. Information and Computer Science, University of California, Irvine, 65 pp. (1998).

Gerstlauer et al., "VHDL+/SpecC Comparisons—A Case Study," Technical Report ICS-98-23, Dept Information and Computer Science, University of California, Irvine, 40 pp. (1998).

\* cited by examiner

Design Tool Software 180 With Structured
Programming Language Approach

200

```
int gcd(int input1, int input2) {
        if ( input1 = = 0 || input2 = = 0 )
            return 0;
        while ( input1 != input2 ) {
            if ( input1 < input2 )
                input2 -= input1;
            else
                input1 -= input2;
        }
        return input1;
}
```

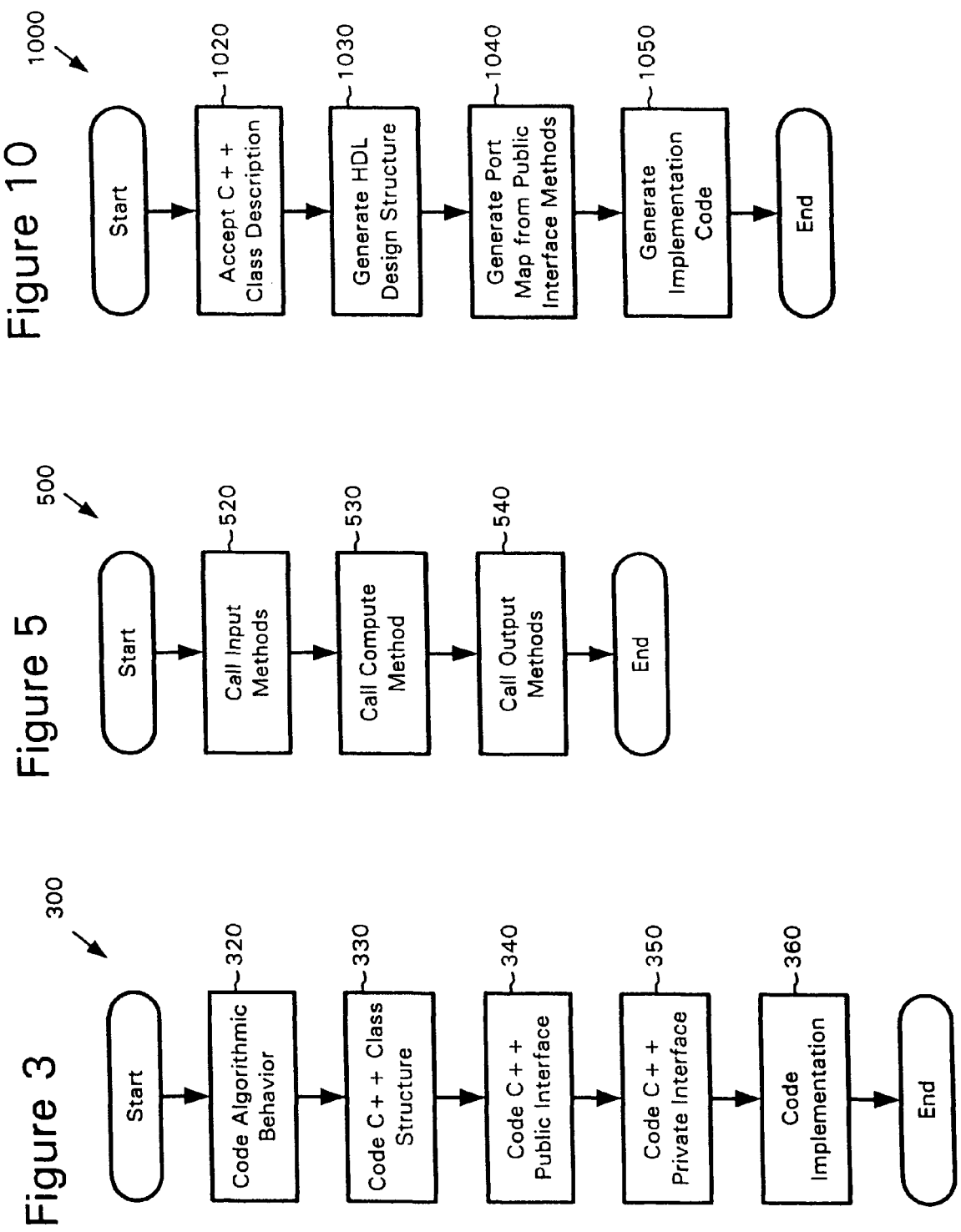

Figure 4

```
        class GCD {
405
   ↘ ⌈  #pragma design
      ⌊
      ⌈  public:
            // Input Ports                                         412
            void input1( int input ) { d_input1 = input; } ⌉
410         void input2( int input ) { d_input2 = input; } ⌋

// Process compute    414
            void compute( void ); ⌉⌋

// Output Ports                          416
            int output( void ) { return d_output; } ⌉⌋

430 ⌈  private:
   ↘        int d_input1;
            int d_input2;
            int d_output;
      ⌊ };

⌈  void GCD::compute( void ) {
                d_output = 0;
                if ( d_input1 && d_input2 ) {
450                    while ( d_input1 != d_input2 ) {
                            if ( d_input1 < d_input2 )
                                    d_input2 -= d_input1;
                            else
                                    d_input1 -= d_input2;
                        }
                        d_output = d_input1;
                }
      ⌊  }
```

```
610
   ┌─ GCD gcd1;                                          600 void Top::compute( void ) {
                                            622
620   gcd1.input1( d_abc + 23 );  ┐
      gcd1.input2( 46 );           ┘
                              624
      gcd1.compute();  ┐
                                              626
      common_denom = gcd1.output();  ┐
      ...
   └─ }
```

Figure 8

```
                                                          800
      class Testbench {
      public:
810       void test( void );
   ┌─ private:
          GCD4 gcd;
      };

void Testbench::test( void ) {
          static int vec[20] = {
              300, 21, 96, 3681,
820           10, 0, 2510, 1111,
              4325, 90100, 50, 275,
              12, 18, 60, 300,
              1, 10, 100, 1000
          };

for ( int i=0; i <= (20-4); ++i ) {
              gcd.input( &vec[i] );
830           gcd.compute();
              cout << "GCD(" << vec[i] << "," << vec[i+1] << ","
                   << vec[i+2]<< "," << vec[i+3] << ") = "
                   << gcd.output() << endl;
          }
      }
```

Figure 7

```
class GCD4 {                                                    700
    public:
        // Input Ports - ( memory or stream )                   712
        void input( int input[] ) { d_input = input; }

// Process compute
        void compute( void );

// Output Ports
        int output( void ) { return d_output; } private:
        // Internal algorithm                                   722
        int get_gcd( int i, int in1, int in2 );

int *d_input;
        int d_output;        724
        GCD gcd[2];
};
```
710 (public block), 720 (private block)

```
int GCD4::get_gcd( int i, int in1, int in2 ) {
    gcd[i].input1( in1 );
    gcd[i].input2( in2 );
    gcd[i].compute();
    return gcd[i].output();
}
```
730

```
void GCD4::compute( void ) {
    d_output = 0;

int tmp_out1 = get_gcd( 0, d_input[0], d_input[1] );
    int tmp_out2 = get_gcd( 1, d_input[2], d_input[3] );

tmp_out1 = get_gcd( 0, tmp_out1, tmp_out2 );

d_output = tmp_out1;
}
```
740

Figure 9

```
struct bitvector4 {                                          900
#pragma builtin
        signed int val : 4;
        bitvector4 () {}
        bitvector4 ( signed int n ) { val = n; }
        signed int operator = ( signed int n ) {val = n; return val; }
        operator signed int () const { return val; }
        signed int operator -= ( signed int n ) { val -= n; return val; }
        signed int operator += ( signed int n ) { val += n; return val; }
        signed int operator *= ( signed int n ) { val *= n; return val; }
        signed int operator /= ( signed int n ) { val /= n; return val; }
        signed int operator ++ () { return ++val; }
        signed int operator ++ ( int ) {
                bitvector4 tmp = val;
                ++val;
                return tmp;
        }
        signed int operator -- () { return --val; }
        signed int operator -- ( int ) {
                bitvector4 tmp = val;
                --val;
                return tmp;
        }
};
```

Figure 12

| Benchmark | GCD | | FIR | | 5th Order Filter | | JPEG | |
|---|---|---|---|---|---|---|---|---|
| original C++ (C++ testbench) | 25 lines | 0.67 seconds | 68 lines | 0.75 seconds | 77 lines | 0.95 seconds | 257 lines | 0.29 seconds |
| original C++ w/FLI (VHDL testbench) | 127 lines | 11.8 seconds | 221 lines | 2.5 seconds | 230 lines | 2.88 seconds | 415 lines | 38.9 seconds |
| VHDL after transformation | 63 lines | 11.6 seconds | 117 lines | 21.5 seconds | 137 lines | 2.4 seconds | 556 lines | 50.6 seconds |
| VHDL after scheduling (cycle accurate) | 78 lines | 37.7 seconds | 305 lines | 42.9 seconds | 173 lines | 3.1 seconds | 1301 lines | 87.4 seconds |
| VHDL structural at RTL level | 353 lines | 210.6 seconds | 1068 lines | 198.9 seconds | 507 lines | 56.9 seconds | 7123 lines | 836 seconds |
| VHDL structural at gate level | 1277 lines | 872.0 seconds | 6234 lines | 3544 seconds | 2767 lines | 1925 seconds | 53219 lines | 3 hours |

1200

STRUCTURED ALGORITHMIC PROGRAMMING LANGUAGE APPROACH TO SYSTEM DESIGN

RELATED APPLICATION DATA

The present application is a divisional of U.S. patent application Ser. No. 10/753,262, entitled "Structured Algorithmic Programming Language Approach to System Design," filed Jan. 5, 2004, now U.S. Pat. No. 7,308,672 which is a continuation of Ser. No. 09/957,442, entitled "Structured Algorithmic Programming Language Approach to System Design," filed Sep. 18, 2001, now U.S. Pat. No. 6,701,501, which claims the benefit of both U.S. Provisional Patent Application Ser. No. 60/240,883, entitled "Synchronous Hardware Description Method," filed Oct. 16, 2000, and U.S. Provisional Patent Application Ser. No. 60/257,923, entitled "Techniques for Rapid Implementation of High-Performance FPGAs From Algorithmic C Specifications," filed Dec. 21, 2000, the disclosures of which are incorporated by reference.

TECHNICAL FIELD

The present invention relates to a structured algorithmic programming language approach to system design. For a design unit, algorithmic programming language techniques simplify the specification of the interface and sub-design unit concurrency. A design tool interprets a structured programming language specification for the design unit and produces an equivalent lower-level specification coded, for example, in a hardware description language such as VHDL.

BACKGROUND

Computer hardware such as an electronic circuit can include thousands or even millions of tiny components. Designing computer hardware at the level of these tiny components is time-consuming and costly. Therefore, hardware designers often use design tools to simplify and speed up the process of designing computer hardware.

When using a design tool, a designer specifies a design unit in a way that abstracts away certain hardware details. For example, the designer might specify the overall behavior, timing, and structure of the design unit, while ignoring the actual low-level hardware components of the design unit. The design tool then transforms the higher-level specification into a lower-level specification that is closer to an actual hardware implementation. By shielding the designer from many of the complexities of the design unit, the design tool makes the design process shorter and more cost effective.

A design tool typically accepts a specification written in a hardware description language ["HDL"] such as VHDL or VERILOG®. A HDL is a language for specifying computer hardware. Most HDLs include specialized constructs and libraries that the designer uses to explicitly specify timing and structural details. Different design tools and HDLs work at different levels of abstraction. For example, behavioral synthesis tools and behavioral HDLs work at a relatively high level of abstraction. Even at a relatively high level of abstraction, however, the syntax of HDLs is awkward and using HDLs requires extensive training. For additional information about electronic design automation, behavioral synthesis tools, and HDLs, see John. P. Elliott, Understanding Behavioral Synthesis, Kluwer Academic Publishers (1999).

Because HDLs are awkward and hard to learn, there is great interest in alternative design approaches that accept specifications as conceived by designers.

Designers are often familiar with a software programming language such as C or C++. To test the algorithmic behavior of a design unit, a designer might code a system-level specification for the design unit using a programming language. Converting the system-level specification into a HDL specification can be problematic, however. The system-level specification typically exists at a higher level of abstraction than the HDL specification and does not require or include details specifying hardware structure and concurrency. Moreover, the system-level specification can include software constructs (for example, pointers) that are difficult to translate to a hardware counterpart.

One way to overcome these difficulties is to make a programming language more HDL-like. For example, some design approaches start with a programming language such as C, and then add support libraries or impose HDL-like conventions, classes, and syntax on the programming language. Rather than simplify system design, these design approaches in effect force the designer to learn another HDL.

U.S. Pat. No. 6,226,776 ["the '776 patent"] describes another programming language design approach. The '776 patent describes specification of a design unit in a standard programming language (for example, ANSI C) without the use of specialized constructs and additional libraries. The '776 patent does not, however, describe an adequate way for a designer to include structurally meaningful organization in a programming language specification at the same time.

Thus, current programming language design approaches fail to realize the potential of a programming language approach to system design.

SUMMARY

The present invention relates to a structured, algorithmic programming language approach to system design. The design approach enables design, synthesis, and validation of structured, system-level specifications, and integrates system-level design into the rest of the design process. This makes the design process easier for system designers to learn and use, reduces the effort required to translate a system-level specification, and allows for fast, efficient simulation.

The algorithmic programming language design approach includes various techniques and tools, which can be used in combination or independently.

According to a first aspect of the design approach, the design approach operates at the algorithmic level of abstraction familiar to system-level designers, and does not require specialized syntax or constructs, training with additional libraries, or familiarity with hardware design. Thus, the design approach is intuitive to system designers. At the same time, the design approach is structured, and a programming language specification includes structurally meaningful organization. For example, the design approach includes techniques and tools for simplifying specification of a design unit interface in a programming language specification and/or simplifying specification of synchronization and sub-design unit concurrency for a design unit.

According to a second aspect of the design approach, the design approach leverages existing simulation technology for validation of a programming language specification at various stages of the design flow. For example, the design approach enables validation of the design unit at early stages in the design flow, which makes testing and debugging faster. The design approach also enables simulation of a programming language specification with pre-existing specifications and testbenches written in a HDL.

According to a third aspect of the design approach, a design tool synthesizes a programming language specification into a lower-level specification, for example, translating from the programming language to a HDL and embedding architectural details. The design tool thus simplifies the translation of an algorithmic, system-level specification to a lower-level specification. Because the programming language specification follows a structured programming language approach, the design tool interprets the programming language specification as having structural significance. For example, the design tool interprets an interface in a programming language specification as specifying a design unit interface in HDL. Or, based upon structural relationships implied in the programming language specification, the design tool generates code for handling sub-design unit concurrency and synchronization.

Additional features and advantages of the invention will be made apparent from the following detailed description of an illustrative embodiment that proceeds with reference to the accompanying drawings.

BRIEF DESCRIPTION OF THE DRAWINGS

FIG. 3 is a flow chart of a design technique according to the illustrative embodiment.

FIG. 4 is a C++ code listing of a C++ class description for the GCD class according to the illustrative embodiment.

FIG. 5 is a flow chart of the execution model of an object of a C++ class representing a design unit according to the illustrative embodiment.

FIG. 6 is a C++ code listing of a C++ class description for the Top class that includes an object of the GCD class according to the illustrative embodiment.

FIG. 7 is a C++ code listing for a C++ class description for the GCD4 class description according to the illustrative embodiment.

FIG. 8 is a C++ code listing for a C++ testbench according to the illustrative embodiment.

FIG. 9 is a C++ code listing for a header file for a bitvector data type according to the illustrative embodiment.

FIG. 10 is a flow chart of a technique for transforming a C++ class description for a design unit into a corresponding HDL description for the design unit according to the illustrative embodiment.

FIG. 12 is a table showing the results of design, synthesis, and simulation at various stages using the design tool of FIGS. 11a and 11b.

DETAILED DESCRIPTION

Figures 1, 2:
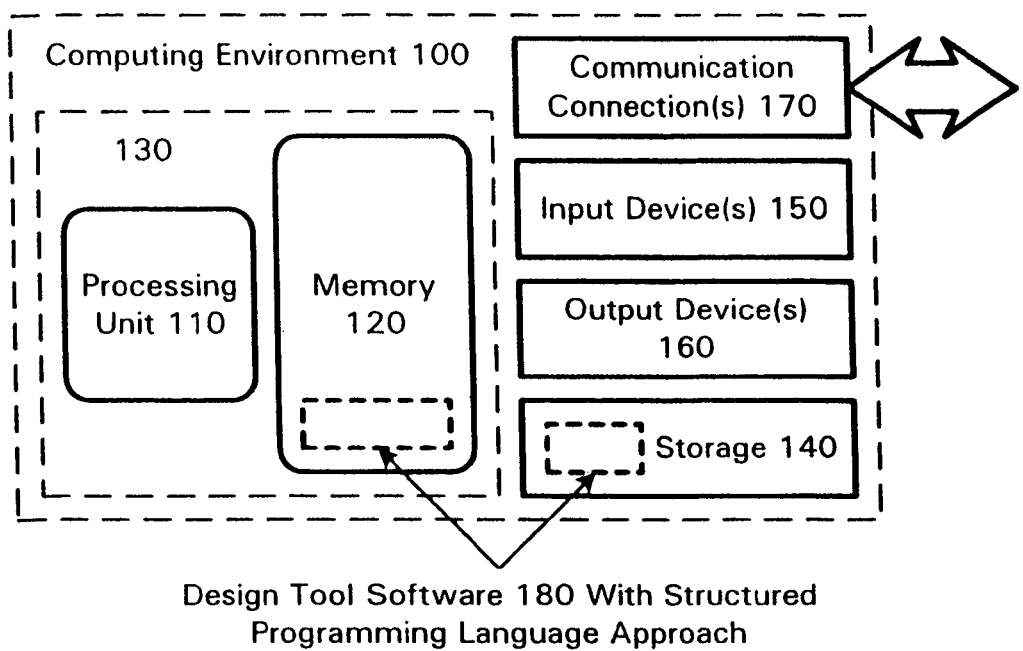
FIG. 1 is a block diagram of a suitable computing environment for implementing the illustrative embodiment.
FIG. 2 is a C++ code listing of a system-level specification of the Greatest Common Denominator ["GCD"] algorithm according to the illustrative embodiment.

The illustrative embodiment of the present invention is directed to an algorithmic C design approach for system design, focusing on the use of C++ as an object-oriented extension of C. The design approach supports C++ as used by system designers, includes both synthesis and verification, and integrates structured, system-level design into the rest of the design process. Thus, the design approach makes the design process more efficient, shortening the learning curve for designers and reducing time-to-market.

The algorithmic C design approach automates the translation of a structured, system-level specification with C++ code to a lower-level specification. For example, a design tool synthesizes an algorithmic-level C++ specification into a lower-level specification in a HDL or programming language variant. The HDL can be VHDL, VERILOG®, or another language for describing hardware. Taking into account a target technology and performance/area requirements, the design tool can produce a still lower-level specification. Architectural decisions can be made by the designer and implemented by the design tool. Thus, the design approach integrates system-level design into the rest of the design process and helps the designer participate in architectural exploration.

The algorithmic C design approach uses mixed C++ and HDL simulation and validation to further integrate system-level design into the rest of the design process. For example, the algorithmic C design approach enables simulation and validation of a C++ specification at the algorithmic stage as a regular C++ program. System-level specifications according to the algorithmic C design approach are compact and execute quickly, which speeds up testing and debugging at the algorithmic stage. The design approach also leverages existing HDL simulation technology for co-simulation with pre-existing HDL IP and simulation and validation of lower-level specifications.

Capitalizing on the encapsulation capabilities of the C++ programming language, the algorithmic C design approach allows the designer to partition the specification into one or more C++ classes with well-defined semantics. Because of the defined semantics, a design tool can later interpret a C++ class in a structural way to specify a hardware module and interface. Similarly, relationships between instances of the C++ classes model structural relationships in design units. The algorithmic C design approach results in modular design unit code that is easy to debug, maintain, uses with other code, and reuse.

The algorithmic C design approach is intuitive to designers familiar with C/C++ or object-oriented programming. It preserves C++ syntax. No constructs or specialized libraries are required to represent hardware concepts, and specification of implementation-related concepts is supported through native C++ constructs whenever possible. Addition C++ constructs can be added with C++ libraries. For example, the bit-width of a variable is specified using a native construct in an additional C++ library. While the algorithmic C design approach requires only basic knowledge of object-oriented C++, more experienced designers can use the algorithmic C design approach to create more powerful design units using advanced techniques like templates and derived classes.

The basic element of the C++ specification is an object declared as a C++class, representing a design unit. The object contains, among other things, a constructor for a reset action, public methods and data objects, and private methods and data objects. The public methods and data objects of the object are part of a public interface encapsulating the functionality of the design unit. Based upon explicit semantics, public methods corresponding to input and output ports of the design unit define how the design unit receives input and produces output. Another public method corresponds to the main process of the design unit. By leveraging object-oriented programming conventions, the algorithmic C design approach simplifies design and avoids the use of additional classes, non-native constructs, and arcane conventions, while at the same time providing structurally meaningful organization to design units.

To simulate the performance of the design unit, the execution model for the object is as follows. First, the inputs to the object are set through the input port methods of the public interface of the object. Next, the main algorithmic method of the object executes. Finally, the outputs from the object are retrieved through the output port methods of the public interface. In particular, this execution model is very natural for describing digital signal processing blocks of behavior where the outputs of such blocks are periodically computed.

A system-level specification for a design unit is typically a sequential program that lacks threading code or other code modeling concurrent execution of sub-design units of the design unit. Keeping the level of abstraction at the algorithmic level, the algorithmic C design approach treats concurrency like a system-level specification. Concurrency can be implied in a sequential programming language specification, but is not explicitly modeled by the designer. Instead, the designer implies parallel execution by using multiple instances representing sub-design units. A design tool synthesizing the programming language specification analyzes data and control flow in the specification and recognizes the potential for concurrent execution of the sub-design unit instances, much like scheduling in a behavioral synthesis tool finds parallelism in a data flow graph. The design tool then generates HDL code for exploiting concurrency between sub-design unit instances in the design unit.

As long as specification and simulation is at the algorithmic level, handshaking code controlling when data should be passed to and from the design unit is not needed. When the C++ specification is converted to HDL or simulated with other design unit code, however, a design tool later adds handshaking code. Similarly, hierarchical relationships between design units are specified without special, additional libraries or glue code between the design units. Instead, design units interrelate as component instances in the C++ specification; an object of a C++ class instantiates and calls the methods of another object. A design tool later adds code to pass signals between the design units and regulate concurrency.

Standard C++ programming tools help debug the C++ specification and test the algorithmic behavior of the design unit. An off-the-shelf, C++ compiler compiles the C++ specification into an executable, whose behavior is then tested through a set of testbenches. Simulation of behavior at the algorithmic level is typically faster than other types of simulation, due primarily to the absence of eventing code, context switches, and other threading mechanisms for modeling concurrency. Simulation of behavior at the algorithmic level also allows the designer to verify algorithmic behavior apart from other aspects of the design. To simulate the C++ specification with waveform input and/or other design units, a wrapper interfaces the C++ specification with an HDL simulation tool. Simulation of the C++ specification can also be mixed with simulation of other HDL specifications.

The algorithmic C design approach is not restricted to modeling hardware. Instead, it can be used to specify behavior that is to be implemented as a system that combines both hardware and software. Thus, system-level designers without hardware design experience can contribute to design.

A design tool facilitates specification of a design unit as a C++ class. The design tool facilitates debugging, compiling, and simulating a C++ specification, as well as synthesis of the C++ specification into a HDL specification and behavioral simulation. The design tool also performs lower-level synthesis and simulation.

While the illustrative embodiment is presented in terms of a single, unified design approach, various techniques and tools for design, synthesis, and simulation according to the design approach can be independently implemented and used. In alternative embodiments, these various aspects are used independently, in different combinations, or with other techniques or tools.

The illustrative embodiment is directed to an algorithmic C design approach, focusing on C++. In alternative embodiments, a programming language design approach uses a programming language other than C++, for example, C, a C variant, Java, or a Java variant.

The design approach of the illustrative embodiment emphasizes structured design using C++ classes, but also allows a designer to optionally specify design units as conventional functions. For example, if a design unit has few inputs and outputs and little or no state requirements, the designer can code it as a function, skipping the extra coding needed to make it a C++ class. Later analysis of the function will determine the inputs and outputs for the design unit interface. Coding a design unit as a function slightly simplifies programming and can work well for simple design units, but does not work as well for design units with complex interfaces or if the designer wants control over interface specification. Moreover, coding design units as functions can complicate the management of the internal states of design unit instances. In comparison, coding design units as C++ classes uses encapsulation of internal states within instances of the C++ classes to naturally specify the internal states of design unit instances.

I. Computing Environment

FIG. 1 illustrates a generalized example of a suitable computing environment (100) in which the illustrative embodiment may be implemented. The computing environment (100) is not intended to suggest any limitation as to scope of use or functionality of the invention, as the present invention may be implemented in diverse general-purpose or special-purpose computing environments, including computing environments that lack one or more components shown in FIG. 1.

With reference to FIG. 1, the computing environment (100) includes at least one processing unit (110) and memory (120). In FIG. 1, this most basic configuration is included within dashed line (130). The processing unit (110) executes computer-executable instructions and may be a real or a virtual processor. In a multi-processing system, multiple processing units execute computer-executable instructions to increase processing power. The memory (120) may be volatile memory (e.g., registers, cache, RAM), non-volatile memory (e.g., ROM, EEPROM, flash memory, etc.), or some combination of the two. The memory (120) stores design tool software (180). The design tool software (180) includes software for the algorithmic C design approach.

The computing environment (100) includes storage (140), one or more input devices (150), one or more output devices (160), and one or more communication connections (170). An interconnection mechanism (not shown) such as a bus, controller, or network interconnects the components of the computing environment (100). Typically, one or more layers of operating system software (not shown) provide an operating environment for other software executing in the computing environment (100), and coordinate activities of the components of the computing environment (100).

The storage (140) may be removable or non-removable, and may be magnetic disk, magnetic tape or cassette, CD-ROM, DVD, or any other medium which can be used to store information and which can be accessed within the computing environment (100). The storage (140) stores instructions for the design tool software (180) that includes software for the algorithmic C design approach.

The input device(s) (150) may be a touch input device such as a keyboard, mouse, pen, or trackball, a voice input device, a scanning device, or another device that provides input to the computing environment (100). The output device(s) (160) may be a display, printer, speaker, or another device that provides output from the computing environment (100).

The communication connection(s) (170) enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The invention can be described in the general context of computer-readable media. Computer-readable media are any available media that carry a modulated data signal and can be accessed within a computing environment. By way of example, and not limitation, with the computing environment (100), computer-readable media include memory (120), storage (140), communication connection(s) (170), and combinations of any of the above.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "accept," "receive," "retrieve," and "determine" to describe computer operations in a computing environment. These terms are high-level abstractions for operations performed by a computer, and should not be confused with acts performed by a human being. The actual computer operations corresponding to these terms depend on implementation.

II. Algorithmic C Design Approach

The algorithmic C design approach allows for both simulation and synthesis of C++ specifications, enabling verification before and after synthesis. A system-level designer specifies the design unit as a C++ class description for a software object. Leveraging object-oriented programming conventions, the designer partitions a specification into one or more C++ classes with well-defined semantics. The designer structures a public interface of an object to represent the interface of a design unit. The object follows an execution model that mimics the behavior of the design unit. The object also interacts with other objects according to the execution model, which mimics the way a design unit interacts with sub-design units. Thus, by applying object-oriented programming conventions to the specification of the design unit, the designer intuitively models the hardware interface and behavior of the design unit. A design tool later interprets a C++ class description in a structural way, producing an equivalent HDL description, and integrating algorithmic, C++ description into the rest of the design process. When compiled with a native C++ compiler, the C++ class description behaves in the structural way.

FIG. 2 shows a C++ code listing for a system-level specification (200) of the Greatest Common Denominator ["GCD"] algorithm, as normally coded by a system-level designer. Written as a function, the GCD algorithm receives two input values, processes the two input values to determine their greatest common denominator, and returns the greatest common denominator.

The GCD function in the system-level specification (200) is invoked from a main routine and interfaced with other code or a testbench module. To make a hardware module for the GCD function, the designer could designate the GCD function as a module (as opposed to an inlined function in synthesis). The system-level specification (200), however, does not clearly indicate the interface for the hardware module; the same variables are used for input/output and internal computations. A hardware module, in contrast, needs to separate internal state from modular behavior.

Because C++ does not have a native way to specify structural aspects of a design unit, the algorithmic C design approach adopts object-oriented programming conventions for supplying structure to an object. In this approach, a system-level specification is partitioned and wrapped as one or more C++ classes. For a C++ class for a design unit, methods of a public interface model I/O ports and behavior of the design unit, while private data models state of the design unit.

FIG. 3 is a flow chart of a design technique (300) followed by a designer specifying a C++ class description for a design unit. Although FIG. 3 shows acts of the design technique (300) in a specific order, certain acts can be combined with other acts, while other acts can be rearranged or performed concurrently depending on the preferences of the designer or the features of a design tool.

The designer initially codes (320) the algorithmic behavior of the class. For example, the designer codes a system-level specification such as the one shown in FIG. 2. To impose modular structure for the design unit, the designer codes (330) a C++ class description in which the algorithmic behavior code is embedded. In C++, a class is a special type of struct. The class encapsulates algorithmic behavior, access to the algorithmic behavior of the class is given by a set of methods of a public interface.

To specify the interface that the design unit presents to a caller, the designer codes (340) the public interface for the class. The coding (340) of the public interface includes coding method declarations for input, output, and algorithmic methods, as well as method implementations for input and output methods. To specify the internal data members and methods for the class, the designer codes (350) the private interface for the C++ class. The designer then codes (360) an implementation of the algorithmic method of the public interface, recasting the algorithmic behavior code for the class using private data members.

FIG. 4 is a C++ code listing for a C++ class description (400) designed according to the technique (300) shown in FIG. 3. The C++ class description (400) follows a style that a design tool interprets in a structural way. Moreover, when compiled with a native C++ compiler, the C++ class description (400) behaves like an equivalent HDL description.

The C++ class description (400) includes a specific PRAGMA (405) design that annotates the class as representing a structural block with ports. The C++ class description (400) includes a public interface (410), a private interface (430), and an implementation (450) of the method compute, which implements the substance of the GCD algorithm. The various aspects of the design and use of the C++ class description (400) are described in detail below.

FIG. 5 shows a flow chart of the execution model (500) for an object of a C++ class, for example, an object of the GCD class. The execution model (500) mimics the behavior of a design unit called by a caller such as another design unit. In particular, the execution model (500) naturally describes digital signal processing blocks of behavior where the outputs of such blocks are periodically computed.

First, the caller calls (520) input methods of the public interface of the object. Calling the input methods corresponds to setting inputs at the input ports of the design unit. Next, the caller calls (530) the compute method of the public interface of the object, which roughly corresponds to the processing of the design unit. Finally, the caller calls (540) the output methods of the public interface of the object, which corresponds to reading outputs at the output ports of the design unit. FIG. 5 does not show input or output handshaking behavior, which can be coded by the designer into the C++ class description but is not necessary in the C++ class description. Synchronization is implied by serial execution and the caller waiting for the compute method to return.

A. Interfaces and Input and Output Methods

In a C++ class used to represent a design unit, the public interface methods represent ports of the design unit interface. Access to an object of the C++ class occurs through the interface; access to the design unit occurs through ports corresponding to methods of the public interface. This makes the design interface explicit yet easy for the user to specify.

With reference to FIG. 4, the C++ class description (400) for the GCD class defines a public interface (410), which is treated as a VHDL ENTITY declaration. Each method in the public interface (410) is converted to an input or output port, except for the compute method and the Constructor/Destructor.

By convention, an input method of the public interface (410) has one input and no return value, while an output method of the public interface (410) has no input and one return value. The corresponding port has the name of the method and the type of the input or return value. In FIG. 4, the input methods (412) input1 and input2 each have one input value and no return value. For these input methods (412), ports of the same names, accepting input of type int, will be created. The output method output (416) has one return value and no input value. For the output method (416), a port named output, returning a value of type int, will be created.

By convention, an input method can pass a shared variable to a design unit to model inout behavior. The input method takes as an input parameter a pointer to the shared variable. The shared variable is accessible to both the design unit and its caller. During execution of the compute method, the design unit reads from and/or writes to the shared variable as necessary. After execution (or after the caller otherwise verifies that results are valid), the caller reads from the shared variable as necessary. Inasmuch as the caller receives output without a call to an output method of the design unit, use of a shared variable to model inout behavior deviates slightly from the execution model of the design unit. Synthesis resolves the shared variable into any of several different structures, as described later.

Alternatively, an inout port is specified by overloading two methods in the public interface. The two methods have the same name. The first method takes an input and the second method returns a value of the same type. For example, a public interface includes the two methods bus1 shown below to specify an inout port named bus1.
void bus1 (uint4);
uint4 bus1 (void);

Using a shared variable to specify inout behavior allows for specification at a high level and in an implementation-independent way. In contrast, overloading public methods allows for specification of inout behavior at the level of HDL inout ports. Specifying an inout port by overloading public methods closely adheres to the calling convention and execution model of the design unit. Inout behavior in most designs, however, is more generally and easily specified by passing a pointer to a shared variable in an input method.

In general, input and output methods assign to/return only internal data members (members defined in the private interface (430) in FIG. 4). By convention, the public interface (410) includes methods but not data members. Making data members publicly accessible can cause synthesis to create port of unknown direction.

By convention, one method of the public interface has no inputs and no return value. In FIG. 4, the compute method (414) of the public interface (410) has no inputs and no return value. The compute method (414), which is alternatively called by another name such as algorithmic method or process method, will be converted to a sequential process which reads the inputs into local variables, executes the algorithm, and then writes the output back. The C++ class description (400) for the GCD class includes the implementation (450) of the compute method (414) below a private interface (430).

A private interface includes data members or methods used within the design unit. The private interface (430) of the C++ class description (400) for the GCD class includes local variables for the design unit that are used in implementations of the methods of the public interface (410).

The code listing for the C++ class description (400) for the GCD class lacks handshaking code. Synthesis will add handshaking code as necessary for synchronization; the designer is not required to address synchronization because he uses the implicit synchronization of the procedure call mechanism. Later, the designer can specify timing constraints for input/output reads/writes inside the design tool. If the designer desires, however, the designer can specify handshaking methods in the public interface. For example, Appendix A, entitled "Template for C++ GCD Class Description With Handshaking Code," shows a C++ class description in which the public interface includes methods input_valid and output_valid for handshaking according to a partial handshaking protocol.

The C++ class description does not address several standard hardware signals. The C++ class description lacks a clock signal; a clock signal is added to the design when it is scheduled. A constructor of the C++ class can be used to specify reset actions. Or, a reset signal can be added as an input method of a public interface or as a reset PRAGMA directive to a synthesis tool.

B. The Compute Method

The compute method of a C++ class description represents the algorithmic process of the design unit. Because the compute method lacks inputs and return values, synthesis can determine that it represents the algorithmic process. The compute method represents a sequential process of reading inputs into local variables, executing computations, and writing the output back from local variables. When accessing the design unit specified in a C++ class description, the compute method is called in order to receive valid results.

In FIG. 4, the compute method implementation (450) includes assignments, a while loop, and a conditional statement. In general, a compute method can contain most C++ algorithmic constructs, including: a) assignments and operators; b) function calls which will be inlined; c) calls to functions of other design units; d) various type of loop (e.g., for, while, do), which may contain conditional or unconditional break or continue statements; e) if and switch statements; f) return statements at any scope; and g) most pointer operations when the address can be statically determined at compile time. On the other hand, the compute method cannot include certain operations that have meaning for software loaded into memory, but not hardware (e.g., non-statically determinable pointer operations). The compute method also cannot include goto statements.

The compute method implementation (450) lacks handshaking code. Synthesis will add handshaking code as necessary for synchronization, so the designer is not required to address synchronization during design. If the designer desires, however, the designer can specify at least some handshaking code in a class description. For example, Appendix A shows a GCD class description in which the private interface includes local variables for handshaking for a partial handshaking protocol. The constructor initializes the local variable for output (d_output) to 0 before input_valid will be checked. The compute method implementation includes handshaking code for output handshaking to indicate that output has been computed. When the code of Appendix A is synthesized, output_valid is false except when output contains the correct, valid result. In addition, synthesis will add code for input_valid to synchronize execution of the algorithm.

C. Hierarchy and Structure

Once a designer creates a C++ class description, an object of the C++ class can be instantiated in other design units that require the functionality encapsulated by the object. An instance of the C++ class represents a hardware instance. Unlike a software instance, however, the hardware instance is a static object that lasts the duration of the simulation.

In general, when a designer creates a C++ class description for a design unit and needs to use another function inside the design unit, the designer may either use a function call (which will be inlined) or instantiate another object that serves the function. For synthesis to recognize access to the instantiated object, the top-level class description follows the execution model of the algorithmic C design approach, calling the public methods of the instantiated object. The relation between the objects is established by instantiation, and communication between the objects occurs chiefly through function calls to public methods. Thus, the designer specifies hierarchical relations between design units using intuitive object-oriented programming practices. The design process is easier and faster as well, because the designer is not required to code flow logic for signals between the design units, which can be time-consuming and tedious. Also, the designer can ignore concurrency and handshaking between the design units, which synthesis will address as necessary.

FIG. 6 is a C++ code listing for a C++ class description (600) of the Top class, which includes an instantiation (610) of an object gcd1 of the class GCD. The compute method (620) of the Top class description (600) includes calls to the public methods of the object gcd1. First, calls (622) to the input1 and input2 methods of gcd1 set inputs. Next, a call (624) to the compute method of gcd1 starts processing of the input. Finally, a call (626) to the output method of gcd1 reads the output and assigns the output to the local variable common_denom.

FIG. 7 shows a C++ code listing for a C++ class description (700) for the GCD4 class. The GCD4 class description (700) is a higher-level design that uses two objects of the GCD class in order to compute the GCD of four numbers. In the input method (712) of the public interface (710), the four numbers are passed as an array of integers. The private interface (720) includes a private method get_gcd (722) for calling a GCD object as well as an array (724) of two instantiated GCD objects. The implementation (730) for the private method get_gcd (722) includes calls to a specified GCD object. The implementation (740) for the compute method of the GCD4 class determines the GCD for the first two inputs, the second two inputs, and then the temporary results of the first two GCD operations.

FIGS. 6 and 7 do not show input or output handshaking between objects. If an object supports handshaking, however, the designer includes in the calling object calls to the handshaking methods of the called object. For example, if the object gcd1 of class GCD supported input and output handshaking, the C++ class description for the Top class could include a call gcd1.input_valid(true) after the setting of the input, before the call to the compute method. For output handshaking, the description could include a call to gcd1.output_valid( ) within a while loop to simulate a calling design unit waiting until output_valid is true.

D. Implied Concurrency

According to the algorithmic C design approach, a C++ class description includes sequential statements. Concurrency (parallel vs. serial execution) of sub-design units represented by objects in the C++ class description is not explicitly treated. Concurrency may be implied, however, when two objects representing sub-design units are accessed sequentially. The two objects cannot share memory, nor can one object be dependent on output from the other object. In FIG. 7, for example, the two calls to get_gcd (each call for a different instance of the sub-design unit class GCD) are not dependent upon each other, and thus indicate good candidates for concurrency. Multiple instances of the same class or multiple instances of different classes can represent sub-design unit instances capable of concurrent execution.

To the extent concurrency exists in a design, a design tool later allows the designer to exploit that concurrency if the designer chooses to do so. The design tool analyzes data and control flow in the C++ specification and recognizes the potential for concurrency in the execution of sub-design unit instances. The design tool can then generate HDL code for exploiting the concurrency.

Compared with other programming language design approaches, the algorithmic C design approach simplifies programming for the designer and lets the design tool explore concurrency options for sub-design unit instances later in the design flow. In particular, using multiple instances of a single sub-design unit class (as opposed to requiring separate programming to specify each of multiple sub-design units) streamlines programming and naturally models the case of multiple, identical sub-design unit instances. Moreover, executing C++ code for the multiple instances does not impose simulation overhead like approaches that use threading code, eventing code, or a support kernel when modeling concurrency during programming language simulation.

E. C++ Testbench

To test the algorithmic behavior of the C++ class description, the designer creates a C++ testbench. The C++ testbench is written in the same style as the class description to allow synthesis to easily convert it to an HDL testbench. The C++ testbench instantiates an object of the C++ class description and sends test inputs. The C++ testbench can test results, instantiate a monitor object (which remains through later synthesis and validation) to analyze the results, present results to the designer, and/or log results to a file. Alternatively, the C++ testbench can be made part of a system that executes instructions to test the algorithmic behavior of a class description.

FIG. 8 shows a C++ code listing for a C++ testbench (800) for the GCD4 class. The C++ testbench (800) includes a single public method test. The C++ testbench (800) includes an instantiation (810) of an object of the type GCD4. The method test loops (830) through a vector (820) of input values. The method test calls the input port method of the GCD4 object, passing values from the vector (820) of input values, and then calls the compute method of the GCD4 object. Next, the method test calls the output method of the GCD4 object and causes the results of the GCD of the 4 input values to be displayed.

Following the algorithmic C design approach, a C++ class description and C++ testbench are compilable with a standard compiler without extensions. Moreover, the behavior of the C++ program matches the behavior of the generated HDL description.

F. Simulation of Hardware Data Types

Some native C++ data types translate naturally to hardware data types at the HDL level. For example, the C++ data type int (a four byte, signed integer) translates naturally to the HDL data type signed (31 downto 0). By convention, a designer uses native C++ data types in a C++ class description, which are compatible with a standard C++ compiler.

On the other hand, certain hardware data types at the HDL level lack an analogous native C++ data type. For example, in a hardware implementation, reducing the bit width of an operator can improve area and timing of a hardware implementation, while there is little or no improvement for a software implementation. Accordingly, C++ lacks a native data type for bitvectors. For such a hardware data type, the designer optionally adds a C++ library defining a corresponding C++ data type and operations on the data type to produce better results through-synthesis. The added data type is compilable with standard C++_compilers and behaves as the equivalent HDL data type. This allows the designer to verify that a design works correctly with data members that are not specified with native C++ constructs.

FIG. 9 shows a C++ code listing for a header file (900) for adding a bitvector4 data type (a bitvector with 4 bits) to a C++ design environment. The header file (900) defines operations for the bitvector4 data type. The bitvector4 data type is compilable with standard C++_compilers and behaves as the equivalent HDL bitvector type.

G. Advanced Programming Techniques for Reusable IP

To create and test a C++ class description, a designer need only follow simple, intuitive programming conventions when coding the class description. More advanced programming techniques are available, however, to make the design process even more efficient and to make code easy to reuse.

The designer can write C++ templates to create reusable, easily modifiable C++ class descriptions. For example, Appendix A shows an example of a GCD class description written as a C++ template, with the type uint8 used for inputs and output. Using C++ templates, the designer can specify data types for data members of a class. Alternatively, a code wizard automates the process of generating C++ template code for C++ class descriptions.

A designer can also use generics to create reusable IP in C++. As in VHDL, generics can be used to set data widths, constants, or other values statically.

The designer can design the constructor for a C++ class to accept inputs (such as generics) affecting the design unit, which promotes reuse of the design unit in different environments. For example, the designer can code the constructor for a C++ class to accept inputs to set sizes for dynamically allocated RAMs inside the design unit. In practice, these sizes have a default value or the values are specified when an object of the class is instantiated.

III. Transformation of C++ to HDL

A design tool transforms a C++ class description for a design unit into an equivalent HDL description for the design unit, integrating the algorithmic, C++ description into the rest of the design process. The C++ class description includes C++ constructs that implicitly correspond to elements of a hardware design. In comparison, the HDL description includes explicit constructs specifying the elements of the hardware design.

Following a set of transformation rules, the design tool interprets C++ constructs to determine corresponding hardware design elements and explicit HDL constructs, for example, VHDL constructs. Thus, for a C++ class description coded according to the algorithmic C design approach, the set of transformation rules defines an interpretation.

FIG. 10 shows a technique (1000) for transforming a C++ class description for a design unit into a corresponding HDL description for the design unit. First, the design tool accepts (1020) a C++ class description for the design unit, for example, the GCD class description (400). Next, the design tool generates (1030) an HDL design structure such as one including ENTITY and ARCHITECTURE declarations. Based upon the input and output methods of the public interface of the C++ class description, the design tool generates (1040) a port map of the HDL description. Finally, the design tool generates (1050) implementation code for the design unit in the HDL description. The implementation code includes process code based on the implementation of the compute method of the C++ class description. The implementation code also includes synchronization code around the process code. If the design unit includes sub-design unit objects, the implementation code includes logic necessary to interconnect to the sub-design unit objects.

Various aspects of transforming a C++ class description to a HDL description are described in more detail below.

A. Transformation of Scalar Data Types

For certain scalar data types (e.g., integers, chars, bool), equivalent data types can be found in software as well as in hardware description languages. These data types translate naturally from C++ to VHDL. Table 1 shows several native C/C++ scalar data types and corresponding VHDL interpretations as used in a typical C compiler.

TABLE 1

Transformation of Scalar Data Types

| C/C++ description | VHDL interpretation |
|---|---|
| int | signed(31 downto 0) |
| unsigned int | unsigned(31 downto 0) |
| short | signed(15 downto 0) |
| unsigned short | unsigned(15 downto 0) |
| char | signed(7 downto 0) |
| unsigned char | unsigned(7 downto 0) |
| bool | std_logic |
| int7 | signed(6 downto 0) |

Additional fixed-point data types may be defined, and will be interpreted correctly by synthesis. By convention, floating-point types are implemented as fixed-point types. HDLs provide bitvector data types, where the bit width of variables and interconnections can be specified. Native C++ scalar data types or additional data types added in a special library (as described in section II.F.) are mapped to their bitvector equivalent of appropriate length.

B. Transformation of Compound Data Types

In C++, compound data types like arrays and records group other data types. Many compound data types are also provided by HDLs, so a design tool directly translates the native C++ compound data types into their HDL equivalent. Table 2 shows several native C/C++ compound data types and corresponding VHDL interpretations.

TABLE 2

Transformation of Compound Data Types

| C/C++ description | VHDL interpretation |
|---|---|
| char[12] | array(0 to 11) of signed(7 downto 0) |
| struct { | record |
|   short re, im; |   re, im: signed(15 downto 0); |
| } | end record |

Native C++ classes are similar to structs, but are also used to define structural design units in the algorithmic C design approach. The design tool treats a native C++ class like a data type unless a PRAGMA annotates it as a design (see Table 4). A call to a non-static function is treated as a call to a function in which a pointer argument to the object is passed as an argument.

C. Transformation of Pointers

Software runs on a computer where local data and instructions are stored in computer memory. The use of pointers to addresses within the computer memory is an efficient way to reference data. Passing the address of an object gives access to the object. Pointers are also the basis for dynamic memory allocation. In contrast, HDLs are for hardware design. Hardware designs have a limited amount of specialized memory, and variables are stored in dedicated registers, but there is no direct equivalent of global memory addresses of variables. Therefore, HDLs do not provide pointers and dynamic memory allocation, or do so only in a simple form.

When using C++ to specify a design, the use of pointers is restricted. An instantiation of an object of a C++ class for a design unit is interpreted as a static creation event. Dynamic allocation and freeing of objects in memory are not allowed with pointers, however, dynamic memory allocation can be explicitly coded in the C++ specification.

Other applications of pointers are allowed, however, for example, the use of pointers for array accesses. Arrays in C/C++ are commonly modeled as pointers to elements, so accessing arrays often uses pointer arithmetic and manipulation. A design tool replaces the explicit pointers in these accesses with an index into the array instead, as shown in Table 3.

TABLE 3

Array Access Via Pointers

| C/C++ description | VHDL interpretation |
|---|---|
| char a[25]; | variable a: array(0 to 24) of |
| char *ap = a; |   signed(7 downto 0); |
| for ( ... ) { | variable ap: 0 to 24; |
|   x += *ap; | ap = 0; |
|   ap++; | for ( ... ) loop |
| } |   x = x + a(ap); |
| |   ap = ap + 1; |
| | end loop; |

Another application of pointers is to pass addresses of objects in function calls. A design tool transforms this kind of pointer by inlining the function call and replacing the pointer inside the function by the object which was passed. Inlining increases code size, but increases parallelism and reduces control dependencies. As a consequence of function inlining, recursion cannot be handled. Since recursion requires a call stack with dynamical allocation of memory for variables, recursion is avoided for hardware designs.

Still another application of pointers is in the modeling of inout behavior with shared variables, in which an input method includes as a parameter a pointer to a shared variable. In this situation, the design tool resolves the pointer into any of several different structures, depending on the usage of the shared variable, the size of the shared variable, input/output scheduling constraints, and/or other interface constraints. For example, if the design unit both reads from and writes to the shared variable, the design tool can transform the shared variable into a memory interface (including a data bus, address bus, and control signals), a simpler interface such as an array of signals, or a signal. On the other hand, if the design unit does not both read from and write to the shared variable, the design tool can transform the shared variable into an input port or an output port as appropriate. Later synthesis and architectural exploration can give the designer other chances to explore tradeoffs in memory architectures.

D. Transformation of Sequential Statements

HDLs allow a mixture of structural and behavioral descriptions. Allowed behavioral descriptions include common control structures such as for loops, while loops, if then-else statements, case statements, and procedure calls. A design tool directly translates native C/C++ control structures into their VHDL equivalent. Some native constructs do not translate directly into VHDL (e.g., continuation over switch-branches and non-loop break statements), but equivalent code exists in native constructs.

E. Transformation of C++ Description for Structure and Interface

A design tool interprets a C++ class description that follows the algorithmic C design approach as a structural block with ports. Table 4 shows the structural framework of a C++ class description and its VHDL interpretation.

TABLE 4

Classes as Design Units

| C/C++ description | VHDL interpretation |
|---|---|
| class A { | Entity A is |
| #pragma design | Port ( |
| // private data members | ... |
| ... | ); |
| // private methods | end A; |
| ... | Architecture CPP of A is |
| public: | begin |
| // constructor | ... |
| ... | end CPP; |
| // public methods | |
| ... | |
| } | |

The C++ class description includes a PRAGMA design that indicates to the design tool that the C++ class should be interpreted as a structural block with ports (as opposed to a simple struct data type). The VHDL interpretation for the C++ class description includes the declarations ENTITY and ARCHITECTURE. The ENTITY declaration specifies an interface for the design unit, including input and output ports of the design unit. The ENTITY declaration can also specify generic values used in parameterizing the design unit. The ARCHITECTURE declaration specifies the functionality of a design, and can include concurrent signal assignment statements, instantiations, and a process. The ARCHITECTURE declaration also includes private data member declarations.

The design tool interprets the input and output methods of the public interface of the C++ class description as corresponding ports within the ENTITY declaration. Table 5 shows public input and output methods of a C++ class and their VHDL interpretation. Tables 5 shows an inout port specified by method overloading, which emphasizes the execution model and calling convention for this simple design unit.

TABLE 5

Deriving I/O Ports

| C/C++ description | VHDL interpretation |
|---|---|
| // public interface<br>void inp1(int arg);<br>void io2(char arg);<br>char io2( );<br>short out3( ); | Port (<br>  -- default interface<br>  clk : in std_logic;<br>  reset : in std_logic;<br>  start : in std_logic;<br>  done : out std_logic;<br>  -- derived from public interface<br>  inp1 : in signed(31 downto 0);<br>  io2 : inout signed(7 downto 0);<br>  out3 : out signed(15 downto 0)<br>); |

Methods with one argument and no result are interpreted as input ports (one input/no output), while methods with one result and no argument are interpreted as output ports (no input/one output). An input method including a shared variable as an argument can model inout behavior. Alternatively, if an input method and an output method have the same name, and the input data type matches the output data type, the design tool creates an inout port within the ENTITY declaration. In an alternative embodiment, the design tool performs lifetime analysis on a public method to determine a corresponding HDL structure.

Aside from input and output ports, the design tool adds a clock signal, a reset signal, and synchronization signals as ports within the ENTITY declaration. The design tool interprets a method of the public interface with no arguments and no results as a process.

F. Transformation of C++ Algorithmic Method into HDL Process

For a compute method of a C++ class, a design tool generates corresponding HDL code according to a synchronization protocol. The synchronization protocol emulates the way a C++ method is invoked. Table 6 shows a C++ class with a compute method and its interpretation as a VHDL process.

TABLE 6

Generating Process Body

| C/C++ description | VHDL interpretation |
|---|---|
| // constructors<br>A( ) {<br>  // constructor code<br>  ...<br>}<br>// public interface<br>void inp1(int arg) {<br>  d_inp1 = arg;<br>}<br>short out3( ) {<br>  return d_out3;<br>}<br>void compute( ) {<br>  // main functionality<br>  ...<br>} | compute: process<br>  -- private data members<br>begin<br>  -- transformed constructor code<br>  ...<br>  main: loop<br>    done <= '0';<br>    -- synchronous wait<br>    wait until clk'event and clk='1' and start='1';<br>    exit when rst = '1';<br>    -- read port for each input<br>    d_inp1 := inp1;<br>    -- transformed main functionality<br>    ...<br>    -- write port for each output<br>    io3 <= d_out3;<br>    -- set done and wait<br>    done <= '1';<br>    wait until clk'event and clk='1';<br>    exit when rst = '1';<br>  end loop;<br>end process; |

By convention, a C++ class description has one public method without input or output, called the compute method in Table 6. The compute method holds the main functionality of the design unit and is invoked by the caller of the functionality after inputs are supplied. In a HDL description, the main functionality of a design is kept in one or more processes. Whereas a C++ method is explicitly invoked by a caller, a HDL process is always active and running. A HDL process is independent or uses handshaking to synchronize with other processes. Thus, a design tool generates HDL code according to a synchronization protocol that emulates the way a C++ method is invoked.

When generating the HDL code for the process, the design tool retrieves values for generics from constructor inputs or values in templates. The process executes constructor code then enters a main loop. For the main loop, the design tool generates signal assignment statements for input and output methods of the public interface, reading input ports (or a shared variable) into private data members and writing private data members to output ports (or a shared variable). The design tool adds handshaking code to synchronize execution of the design with a clock signal (rising edge in Table 6) and input (e.g., start signal) or output (e.g., done signal) handshaking. Thus, the main loop waits until the start signal is set, reads the inputs, and then executes the body of the process. The main loop then writes outputs, sets the done signal, and waits for the next invocation. When the reset signal is set, the constructor code is executed again, making the behavior closer to the hardware implementation.

The main functionality of the process includes sequential statements corresponding to statements within the compute method. The design tool inlines private methods of the C++ class description into the process. The design tool interprets non-fundamental data objects instantiated in the C++ class as sub-design units. For interconnection with these sub-design units, the design tool can add handshaking and interconnection code.

G. Transformation of C++ Object Hierarchy

The design tool interprets hierarchical object relationships within a C++ class description as representing a structural hierarchy of design units. Table 7 shows a C++ class description for the Top class (which includes an object of the class A) and its VHDL interpretation.

TABLE 7

Component Instantiation

| C/C++ description | VHDL interpretation |
|---|---|
| class Top {<br>  ...<br>  A a1;<br>  ...<br>}; | Architecture CPP of Top is<br>begin<br>  ...<br>  signal a1_start: std_logic := '0';<br>  signal a1_done : std_logic;<br>  signal a1_inp1 : signed(31 downto 0);<br>  signal a1_out3 : signed(15 downto 0);<br>  ...<br>  a1 : A<br>    port map (<br>      clk => clk;<br>      rst => rst;<br>      start => a1_start;<br>      done => a1_done;<br>      inp1 => a1_inp1;<br>      out3 => a1_out3;<br>    );<br>  ...<br>End CPP; |

The design tool interprets non-fundamental data objects (e.g., objects annotated with the PRAGMA design) instantiated inside the C++ class description as being instances of sub-design units. For the HDL description, the design tool translates an instance in a C++ class description by generating local signals, an instance of the sub-design unit, and a port mapping.

In Table 7, the Top class includes an instance a1 of the class A. The design tool interprets the instance a1 as an instance of a sub-design unit within the HDL description for Top. The design tool generates a local signal corresponding to each port of the sub-design unit, with the exception of the clock and reset signals, which are passed through from the design unit to the sub-design unit. Although the clock signal is used for synchronization in the HDL description, real RTL clock accurate timing is not generated until later in the design flow.

The design tool creates an instance of the sub-design unit in the HDL description and maps the local signals to the ports of the sub-design unit. Because the design tool generates the signal interconnection logic between the design unit and the sub-design unit in the HDL description, the designer is saved from the time-consuming task of manually coding this interconnection logic.

A C++ object is accessed through methods of its public interface, while an instance of a sub-design unit of a HDL description is accessed through ports. Table 8 shows access of an instance of a C++ class and its VHDL interpretation.

TABLE 8

Component Invocation

| C/C++ description | VHDL interpretation |
| --- | --- |
| a1.inp1(x+y); | a1_inp1 <= x+y; |
| a1.compute( ); | a1_start <= '1'; |
| | wait until clk'event and clk='1'; |
| | ... |
| | wait until clk'event and clk='1' and a1_done='1' |
| | a1_start <= '0'; |
| short w = a1.out3( ); | w := a1_out3; |

The design tool translates calls to public methods in the C++ class description by generating signal assignments and synchronization code in the HDL description. The design tool translates each method of the public interface of the C++ class description independently, and the behavior of the HDL description matches the behavior of the C++ class description.

In the C++ class description shown in Table 8, the calling object sets the input data by calling the input methods of the instance a1. The calling object calls the compute method of the instance a1 to simulate a processing cycle. The calling object then retrieves the results by calling the output methods of the instance a1. Table 8 does not show input or output handshaking in the C++ class description, but a designer could include handshaking code. To model inout behavior with a shared variable, the calling object passes a pointer to the shared variable and retrieves results from the shared variable following execution of the compute method.

The design tool interprets the input method calls as assignments to the corresponding signals mapped to ports of the instance a1 sub-design unit (or, for a shared variable, as assignments to the corresponding structure for the shared variable). For the compute method call, the design tool generates synchronization code, which triggers execution of the process of the sub-design unit at the correct time. The design tool interprets the output method calls as reads from the corresponding signals mapped to ports of the instance a1 sub-design unit (or, for a shared variable, as reads from the corresponding structure for the shared variable). Because the design tool generates the synchronization code in the HDL description, the designer is saved from time-consuming and error-prone manual coding.

IV. Design Tool

In the illustrative embodiment, a design tool facilitates design, simulation, and synthesis according to the algorithmic C design approach. The design tool also performs behavioral and lower-level synthesis as well as simulation at those stages of the design flow.

Figure 11A:
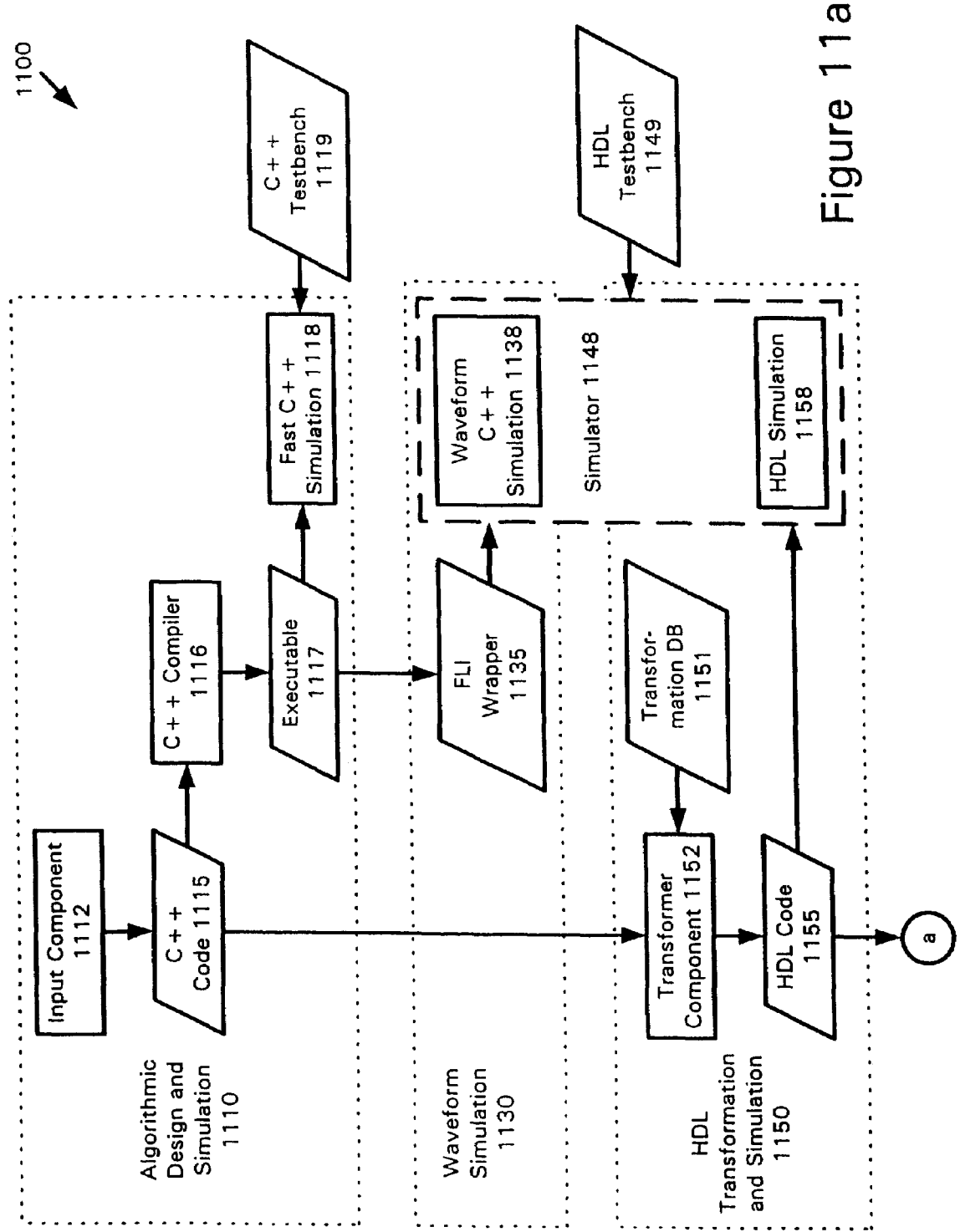
FIGS. 11a-11b are a block diagram of a design tool used in conjunction with the algorithmic C design approach of the illustrative embodiment.
Figure 11B:
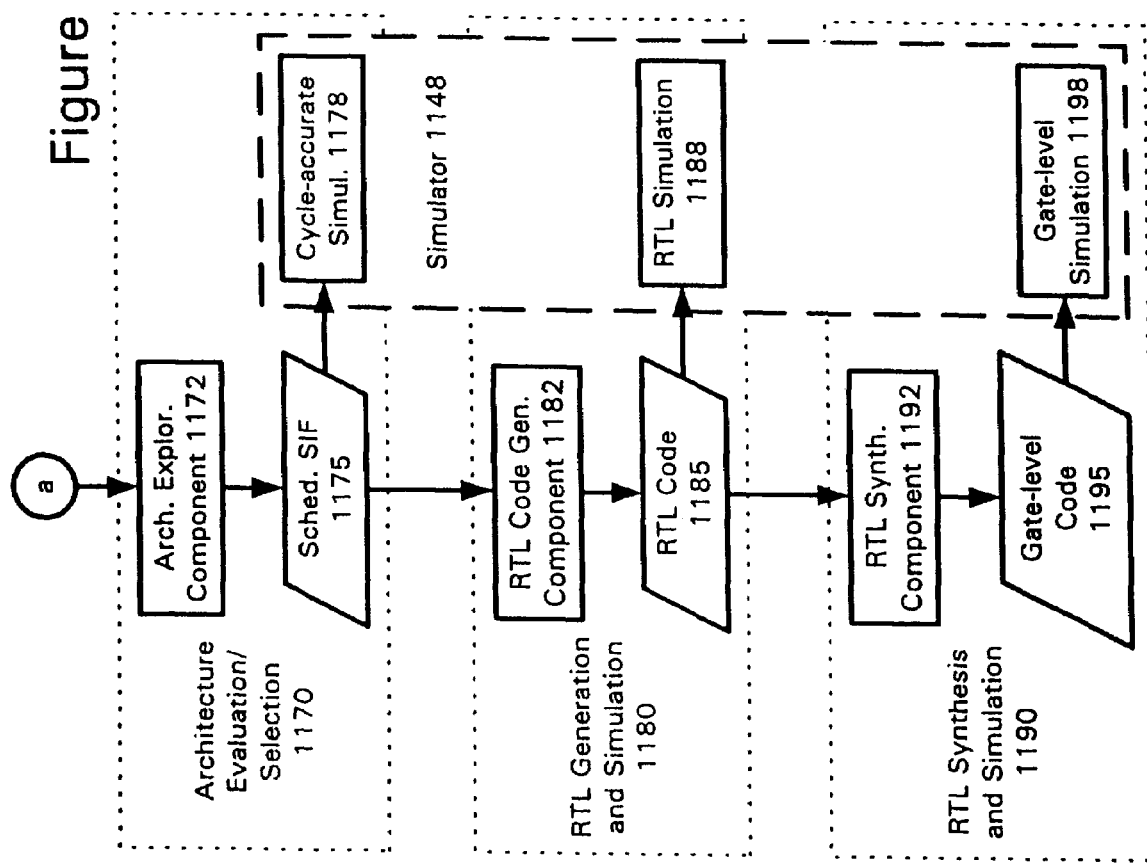

FIGS. 11a and 11b are a block diagram of a design tool (1100) that facilitates the algorithmic C design approach, including various components for different stages of the design flow. After the algorithmic design and simulation stage (1110), the design flow includes synthesis and validation at various stages through the RTL synthesis and simulation stage (1190).

For the sake of presentation, FIGS. 11a and 11b present the design tool (1100) as a single tool including multiple components. Other configurations are possible, however. Depending on implementation, components of the design tool (1100) can be added, omitted, split into multiple components, combined with other components, or replaced with like components. In one embodiment, the components of the design tool (1100) are provided through a combination of a standard programming language development suite, an HDL development suite, a behavioral synthesis tool, and an RTL synthesis tool. In alternative embodiments, the algorithmic C design approach is practiced with a design tool having another configuration of components.

In practice, the design flow using the design tool includes numerous loops in which the designer adjusts inputs based upon feedback from the design tool. For the sake of presentation, FIGS. 11a and 11b do not show these loops. In general, the amount of time, processing, and code required increases at each stage in the design flow. By enabling fast algorithmic testing and debugging early in the design flow independent of concurrency modeling, and by separating algorithmic simulation and waveform simulation from HDL simulation, the design tool (1100) simplifies development and reduces time to market.

A. Algorithmic Design and Simulation

During the algorithmic design and simulation stage (1110), an input component (1112) accepts from the designer a specification of a system design. The input component (1112) can be a conventional programming language tool or a system design component, and can accept textual input, input to a graphical environment, a mix of the two, or another kind of input. The specification includes C++ code (1115) for a C++ class description. The specification can also include behavioral description (e.g., for pre-existing IP) coded in VHDL, VERILOG®, or another language, but this code is treated apart from C++ compiling and simulation.

The designer also provides a C++ testbench (1119) to validate the C++ class description. The C++ testbench can be an independent routine that instantiates the C++ class, or part of a system design that instantiates the C++ class. The C++ testbench (1119) is used to check and debug the algorithmic behavior of the C++ class independent of waveform simulation and HDL translation. Alternatively, the design tool facilitates automatic creation of a C++ testbench based upon a C++ class description.

A C++ compiler (1116) compiles the C++ code (1115) along with related project files (possibly including the C++ testbench (1119)) into an executable (1117). When the C++ code includes only native C++ constructs, the C++ compiler (1116) can be a standard, off-the-shelf C++ compiler.

The designer executes the executable (1117) for fast C++ simulation (1118). For example, a testbench routine instantiates a C++ class, loops through possible inputs, and outputs results to file, screen, or another test object. Because the C++ class description lacks code that simulates concurrent execution of sub-design unit instances, executables are small, fast, and relatively easy to write. Because the fast C++ simulation (1118) does not require coding a wrapper, waveform input, or translation to HDL, the fast C++ simulation (1118) quickly provides feedback about algorithmic behavior of the C++ class early in the design process.

B. Waveform Simulation

During the waveform simulation stage (1130), a foreign language interface ["FLI"] wrapper (1135) interfaces the C++ code (1115) with a standard HDL simulator (1148). The FLI wrapper (1135) executes the code for the C++ class description within a simulator object that adds synchronization and connections to input, output, and timing signals. The FLI wrapper (1135) enables testing of the C++ code (1115) with waveform input such as timing signals and input/output signals. The FLI wrapper (1135) also enables simulation of the C++ code (1115) with preexisting HDL IP code in a testbench (1149) for overall system testing. Appendix B shows an example code listing for a FLI wrapper for a design unit.

The designer codes the FLI wrapper (1135), or the design tool automatically generates the FLI wrapper (1135), as follows. A wrapper class is created which uses a template to instantiate the C++ class for the design unit. In the constructor of the wrapper class, a port map is set up for the instance of the design unit being simulated. The port map includes ports for input and output signals, a clock signal, a reset signal, and start and done signals. A process is created for a clk method which is sensitive to the clock signal (e.g., pos_edge of the clk signal).

Simulation consists of reading inputs from the simulation interface, sending the values to the object of the C++ class, executing the compute method, calling output methods of the object, and sending the return values back to the simulator interface. Thus, in the clk method, execution of the object for the design unit is triggered by the clock signal. The clk method checks for a clock signal equal to 1, and executes if the clock signal equals 1. During execution, the clk method reads inputs and sets the done signal to 0. If the start signal equals 1, the clk method executes the compute process and sets the done signal to 1. The clk method then writes outputs.

For waveform C++ simulation (1138), a simulator (1148) simulates the C++ code (1115) as interfaced through the FLI wrapper (1135) against an HDL testbench (1149). The simulator (1148) calls the FLI wrapper (1135) through an HDL description file that contains an ENTITY declaration with a port map and an ARCHITECTURE declaration with foreign attributes. One foreign attribute specifies an initialization routine and the shared library that contains the initialization routine. For example, in Appendix B, the initialization routine is "design_init," the shared library is "design_cpp.so," and the ports named in the ENTITY port map are the names connected to the signals for the design unit in the constructor for the C++ class. The simulator (1148) performs testing specified in the HDL testbench (1149) and outputs results to file or screen, or to another test object for simulation with pre-existing HDL IP.

The simulator (1148) is used for waveform C++ simulation (1138) through a FLI wrapper (1135), HDL simulation (1158), and later simulations as well. The same HDL testbench (1149) can be used for all simulations, or different HDL testbenches can be used. One standard type of simulator (1148) is a ModelSim™ simulator.

C. HDL Transformation and Simulation

During the HDL transformation and simulation stage (1150), a transformer component (1152) transforms the C++ code (1115) into HDL code (1155). As a result, a C++ class description in the C++ code (1115) is converted to an equivalent HDL description in the HDL code (1155). Alternatively, the transformer component (1152) transforms some but not all of a C++ system specification into HDL code, allowing for simulation of HDL code along with execution of the remaining C++ code.

The transformer component (1152) interprets the C++ code (1115) according to a set of transformation rules stored in the transformation database (1151), and outputs corresponding HDL code (1155). One set of transformation rules is described above in the section entitled "Transformation of C++ to HDL." Alternatively, the design tool uses another set of transformation rules.

The transformer component (1152) analyzes data and control flow in the C++ code (1115) and recognizes the potential for concurrent execution of sub-design unit instances, much like scheduling in a behavioral synthesis tool finds parallelism in a data flow graph. Thus, the HDL code (1155) can include code for handling concurrent execution of the sub-design unit instances in the design unit.

For HDL simulation (1158), the simulator (1148) simulates the HDL code (1155) against the HDL testbench (1149). The simulator (1148) performs testing specified in the HDL testbench (1149) and outputs results to file or screen, or to another test object for simulation with pre-existing HDL IP.

D. Architecture Evaluation and Selection

During the architecture evaluation and selection stage (1170), an architectural exploration component (1172) converts the specification of the design unit as expressed in HDL code (1155) to an architecture-specific implementation for a target FPGA or ASIC technology, as expressed in an intermediate format such as scheduled SIF code (1175). Exploration of a wide range of architectures can occur without changing the original C++ specification. The designer evaluates one or more hardware implementations before selecting a hardware implementation that satisfies performance and cost goals desired or required by the designer. Of the stages of the design flow, the architecture evaluation and selection stage (1170) has the most influence on area, performance, and power of an implementation of the design unit.

The architectural exploration component (1172) inputs HDL code (155) including a HDL description for a design unit. The architecture exploration component (1172) also inputs the target technology/directives (not shown) from the designer to constrain and guide the architectural exploration. Alternatively, the HDL code (1155) includes the directives and/or the designer interactively provides the directives during exploration through a graphical user interface or other mechanism. Architectural exploration involves transformations and architectural choices including loop pipelining, mapping of arrays into memories and vice versa, loop transformations such as loop unrolling (which expose parallelism leading to architectures that have higher performance), selection of clock period, selection of the type and number of components that are allocated, and selection of how I/O and operations are scheduled.

During exploration, the designer can guide the architectural exploration component (1172) to consider a range of architectures with different area/performance tradeoffs. For a generated architecture, the architectural exploration component (1172) reports area and performance estimates and generates cycle-accurate netlist that can be simulated in cycle-accurate simulation (1178). Internally, the architectural exploration component (117.2) does automated exploration as well as additional optimizations such as common-sub-expression elimination, dead-code-elimination, constant propagation.

MONET®, a behavioral synthesis tool from Mentor Graphics Corporation, includes components that can be used as the architectural exploration component (1172) and RTL code generation component (1182).

E. RTL Generation and Simulation

During the RTL generation and simulation stage (1180), an RTL code generation component (1182) converts the output of the architectural exploration component (1172) into RTL code (1185). The RTL code (1185) is then simulated in RTL simulation (1188).

The RTL code generation component (1182) performs optimizations to generate. RTL code (1185) with explicit finite state machines and data path components (e.g., registers, multiplexers, functional units). The optimizations include register and component sharing, multiplexer optimization, FSM optimization, and glue logic generation and optimization. The RTL code generation component (1182) can perform the optimizations and RTL netlists in two steps (not shown in FIG. 11b). After the first, the RTL netlist is at the operation level. In contrast, after the second, the RTL netlist is structural (i.e., operations are bound to structural components).

F. RTL Synthesis and Simulation

During the RTL synthesis and simulation stage (1190), an RTL synthesis component (1192) converts RTL code (1185) to gate-level code (1195). The gate-level code (1195) is then simulated in gate-level simulation (1198).

The RTL synthesis component (1192) performs RTL synthesis' optimizations and technology mapping to arrive at a technology-specific gate-level implementation (or a LUT-level implementation for a FPGA). The gate-level code (1195) output by the RTL synthesis component (1192) can then be fed into placement and routing tools (not shown in FIG. 11b).

V. Results.

FIG. 12 is a table (1200) showing the results of design, synthesis, and simulation at various stages using the design tool of FIGS. 11a and 11b. The results show the advantages of the algorithmic C design approach. The algorithmic C design approach enables the creation of compact, structured, system-level specifications of a design unit. Simulation and validation of the system-level specifications is faster than other types of simulation and validation, and provides meaningful results to designers early in the verification flow.

FIG. 12 shows results for various benchmarks, ranging from simple to complex. The benchmarks include: 1) the GCD algorithm called 65,536 times by a testbench; 2) a finite impulse response ["FIR"] filter with 32 coefficients performing 16 multiplications per sample, with a testbench running 10,000 data samples; 3) a $5^{th}$ order filter (a widely used synthesis benchmark) also run on 10,000 samples; and 4) a JPEG image-decoder decoding a 128×128 pixel image.

The table (1200) shows code size (in lines excluding the testbench) for the specifications of the design unit at different stages in the design flow. For these results, the VHDL code was automatically generated by synthesis as described above. The testbenches were written manually, and an identical testbench was used for all VHDL simulations, including the mixed-language simulation.

The table (1200) also shows simulation/run time for the specifications of the design unit at different stages in the design flow. The run time for the C++ examples was obtained by compiling the C++ code and running it as a native program on a host computer. The time includes the time for the testbench and file I/O to report results. The VHDL simulation times were obtained using a ModelSim™ simulator, and include running the testbench and collecting waveform data for the top-level interface signals. Experiments report total elapsed time and were performed on a SUN Ultra 60 computer The table (1200) shows increasing code size through design flow, reflecting the accumulation of implementation code during synthesis. An exception to this trend is simulation of the C++ with the ModelSim™ simulator, reflecting code added by the FLI wrapper. By starting at a system level of abstraction, the algorithmic C design approach reduces the amount of code that must be manually written. Algorithmic synthesis provides implementation and transformation of the code to lower-level, behavioral HDL description. The algorithmic C design approach enables creation of system-level specifications that are easier to understand, debug, and maintain than lower-level specifications.

The table (1200) shows simulation/run time increasing at a greater rate than code size. A major increase occurs at the transition from compiled execution to HDL simulation. Another major increase occurs at the transition from cycle-accurate HDL simulation to structural simulation. Simulation under the algorithmic C design approach enables fast, early validation of system-level specifications.

Having described and illustrated the principles of our invention with reference to an illustrative embodiment, it will be recognized that the illustrative embodiment can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of the illustrative embodiment shown in software may be implemented in hardware and vice versa.

In view of the many possible embodiments to which the principles of our invention may be applied, we claim as our invention all such embodiments as may come within the scope and spirit of the following claims and equivalents thereto.

APPENDIX A

Template for C++ GCD Class Description With Handshaking Code

```
//////////////////////////////////////////////////
// Object: GCD
// Author: Simon Waters, simon_waters@mentor.com
// Description: This object represents the designers DUT.
// The interface is comprised of the public methods, inputs
// and outputs, and the compute process.
//////////////////////////////////////////////////
template <class Ttype = uint8>
class GCD {
public:
    GCD( void );
    // Input Ports
    void reset( bool );
    void input1( Ttype );
    void input2( Ttype );
    void input valid( bool );
    // Output Ports
    Ttype output( void );
    bool output valid( void );
```

APPENDIX A-continued

Template for C++ GCD Class Description With Handshaking Code

```
    // Processes
    void compute( void );
    private:
    bool d_reset;
    bool d_input_valid;
    Ttype d_input1;
    Ttype d_input2;
    bool d_output_valid;
    Ttype d_output;
};
////////////////////////////////////////////////////
// Method: GCD<Ttype>::GCD
// Description: GCD Constructor. Initializes default settings.
////////////////////////////////////////////////////
template <class Ttype>
GCD<Ttype>::GCD( void )
    : d_reset(false), d_input_valid(false), d_output_valid(false)
{
    d_output = 0;
}
////////////////////////////////////////////////////
// Method: GCD<Ttype>::reset
// Description: Set the reset value.
////////////////////////////////////////////////////
template <class Ttype>
void GCD<Ttype>::reset( bool reset ) {
    d_reset = reset;
}
////////////////////////////////////////////////////
// Method: GCD<Ttype>::input1
// Description: Data input.
////////////////////////////////////////////////////
template <class Ttype>
void GCD<Ttype>::input1( Ttype data_in ) {
    d_input1 = data_in;
}
////////////////////////////////////////////////////
// Method: GCD<Ttype>::input2
// Description: Data input.
////////////////////////////////////////////////////
template <class Ttype>
void GCD<Ttype>::input2( Ttype data_in ) {
    d_input2 = data_in;
}
////////////////////////////////////////////////////
// Method: GCD<Ttype>::input_valid
// Description: Set the reset value.
////////////////////////////////////////////////////
template <class Ttype>
void GCD<Ttype>::input_valid( bool valid ) {
    d_input_valid = valid;
}
////////////////////////////////////////////////////
// Method: GCD<Ttype>::output
// Description: Return Data output.
////////////////////////////////////////////////////
template <class Ttype>
Ttype GCD<Ttype>::output( void ) {
    return d_output;
}
////////////////////////////////////////////////////
// Method: GCD<Ttype>::output_valid
// Description: Return Output Valid.
////////////////////////////////////////////////////
template <class Ttype>
bool GCD<Ttype>::output_valid( void ) {
    return d_output_valid;
}
////////////////////////////////////////////////////
// Method: GCD<Ttype>::compute
// Description: Calculate the answer and set the output.
////////////////////////////////////////////////////
template <class Ttype>
void GCD<Ttype>::compute( void ) {
    // Reset action and regular test
    if ( d_rst || d_input1 == 0 || d_input2 == 0 ) {
        d_output = 0;
        return;
    }
    // Read inputs into local variables
    Ttype in1 = d_input1;
    Ttype in2 = d_input2;
    // Execute the computation
    while ( in1 != in2 ) {
        if ( in1 < in2 ) {
            in2 = in2 - in1;
        } else {
            in1 = in1 - in2;
        }
    }
    // Set the output
    d_output = in1;
    d_output_valid = true;
}
```

APPENDIX B

Foreign Language Interface Wrapper

```
////////////////////////////////////////////////////
// ModelSim Interface Description
////////////////////////////////////////////////////
#include "mti.h"
#include "monetc.h"
struct ltstr {
    bool operator( )(const char* s1, const char* s2) const {
        return strcmp(s1, s2) < 0;
    }
};
#include <map.h>
typedef map<const char *, signalID, ltstr> SignalMap;
////////////////////////////////////////////////////
// Object: Model
// Description: ModelSim Wrapper for Design Unit.
////////////////////////////////////////////////////
template <class T>
class Model {
public:
    // Constructor -- Initialize Design Unit and MTI Interface
    Model( interface_list *ports );
    // Destructor -- delete Design Unit
    ~Model( void );
    // Clocked process controller
    void clk( void );
private:
    // List of interface ports
    SignalMap signals;
    // Design Unit Object
    T *model;
    // Internal data for conversions
    unsigned char data_buffer[32];
};
////////////////////////////////////////////////////
// Constructor -- Create Design Unit and clk'd process
////////////////////////////////////////////////////
template <class T>
Model<T>::Model( interface_list *ports ) {
    // Create an instance of the design we want to interface
    model = new T;
    // Get the ports into our map
    while ( ports ) {
        signalID sig = mti_FindPort( ports, ports->name );
        if ( sig ) {
            this->signals[ports->name] = sig;
        }
        ports = ports->nxt;
    }
    // Create one process sensitive to clk
    processID proc = mti_CreateProcess( "clkd",
                        (mtiVoidFuncPtrT)this->clk, this );
    mti_Sensitize( proc, this->signals["clk"], MTI_EVENT );
}
////////////////////////////////////////////////////
```

APPENDIX B-continued

Foreign Language Interface Wrapper

```
// Destructor -- Clean up Design Unit
/////////////////////////////////////////////////////////////////
template <class T>
Model<T>::~ Model( void ) {
  delete model;
}
// ###############################################################
// USER CONFIGURE
// ###############################################################
template <class T>
void Model<T>::clk( void ) {
  // IF posedge clk
  if ( mti_GetSignalValue( this->signals["clk"] ) = = std_logic_1 ) {
    // Read inputs
    mti_GetArraySignalValue( this->signals["input1"],
                this->data_buffer);
    int data_in = signal2long( this->data_buffer, 8 );
    this->model->input1( data_in );
    // Get data_in input
    mti_GetArraySignalValue( this->signals["input2"],
                this->data_buffer );
    data_in = signal2long( this->data_buffer, 8 );
    this->model->input2( data_in );
    mti_SetSignalValue( this->signals["done"], std_logic_0 );
    if (mti_GetSignalValue(this->signals["start"]) = = std_logic_1){
      this->model->compute( );
      mti_SetSignalValue( this->signals["done"], std_logic_1 );
    }
    // Write outputs
    int data_out = this->model->output( );
    long2signal( this->data_buffer, data_out, 8 );
    mti_SetSignalValue( this->signals["output"], this->data_buffer );
  }
}
/////////////////////////////////////////////////////////////////
// ModelSim Cleanup Callback
/////////////////////////////////////////////////////////////////
void quitCB( Model<GCD9> *design ) {
  delete design;
}
/////////////////////////////////////////////////////////////////
// ModelSim Initialization Routine -- Called first to setup FLI
/////////////////////////////////////////////////////////////////
extern "C" {
  void design_init( regionID region, char *param,
              interface_list *generics, interface_list *ports );
};
void design_init( regionID region, char *param, interface_list *generics,
              interface_list *ports ) {
  // Create the design
  Model<GCD9> *design = new Model<GCD9>( ports );
  // Create a Callback to free design when we quit simulating
  mti_AddQuitCB( quitCB, design );
}
ENTITY gcd IS
  PORT (clk : IN std_logic;
        rst : IN std_logic;
        start : IN std_logic;
        done : OUT std_logic;
        input1 : IN UNSIGNED (7 DOWNTO 0);
        input2 : IN UNSIGNED (7 DOWNTO 0);
        output : OUT UNSIGNED (7 DOWNTO 0));
END gcd;
ARCHITECTURE fli_arch OF gcd IS
  ATTRIBUTE foreign : string;
  ATTRIBUTE foreign OF fli_arch : ARCHITECTURE IS
              "design_init design_cpp.so";
BEGIN
END fli_arch;
```

We claim:

1. A non-transitory computer readable storage medium storing computer executable instructions for causing a computer system programmed thereby to perform a method of transforming a programming language specification into a lower-level hardware description language specification, the method comprising:

accepting a programming language specification, the programming language specification including an interface; and based upon a set of transformation rules, transforming plural methods of the interface into plural ports of a port map of a lower-level hardware description language specification of a design unit.

2. The computer readable storage medium of claim 1 wherein the method further comprises:

transforming an algorithmic method implementation of the programming language specification into a synchronized process of the lower-level hardware description language specification.

3. The computer readable storage medium of claim 1 wherein the transforming the interface further includes:

transforming each of zero or more input methods into an input port of the port map; and transforming each of zero or more output methods into an output port of the port map.

4. The computer readable storage medium of claim 1 wherein a method of the interface includes as a parameter a pointer to a shared variable, wherein the shared variable is for modeling inout behavior.

5. The computer readable storage medium of claim 1 wherein the method further comprises:

transforming plural native programming language data types into hardware description language data types.

6. The computer readable storage medium of claim 1 wherein the programming language specification includes one or more values specified in a template, the programming language specification being based upon the template.

7. The computer readable storage medium of claim 1 wherein the programming language specification is for a system including hardware and software.

8. The computer readable storage medium of claim 1 wherein the programming language specification includes a C++ class description.

9. A computer readable storage medium storing the lower-level hardware description language specification of claim 1.

10. A method implemented by a computer, comprising:

accepting a programming language specification, the programming language specification including an interface; and with the computer and based upon a set of transformation rules, transforming plural methods of the interface into plural ports of a port map of a lower-level hardware description language specification of a design unit.

11. The method of claim 10 wherein the method further comprises:

transforming an algorithmic method implementation of the programming language specification into a synchronized process of the lower-level hardware description language specification.

12. The method of claim 10 wherein the transforming the interface further includes:

transforming each of zero or more input methods into an input port of the port map; and transforming each of zero or more output methods into an output port of the port map.

13. The method of claim 10 wherein the interface includes as a parameter a pointer to a shared variable, wherein the shared variable is for modeling inout behavior.

14. The method of claim 10 further comprising transforming plural native programming language data types into hardware description language data types.

15. The method of claim 10 wherein the programming language specification includes one or more values specified in a template, the programming language specification being based upon the template.

16. The method of claim 10 wherein the programming language specification is for a system including hardware and software.

17. The method of claim 10 wherein the programming language specification includes a C++ class description.

* * * * *